US009439288B2

(12) United States Patent
Takizawa et al.

(10) Patent No.: US 9,439,288 B2
(45) Date of Patent: Sep. 6, 2016

(54) MOUNTING STRUCTURE OF CHIP COMPONENT AND ELECTRONIC MODULE USING THE SAME

(71) Applicant: TDK Corporation, Tokyo (JP)

(72) Inventors: Shuichi Takizawa, Tokyo (JP); Kenichi Kawabata, Tokyo (JP)

(73) Assignee: TDK Corporation, Tokyo (JP)

( * ) Notice: Subject to any disclaimer, the term of this patent is extended or adjusted under 35 U.S.C. 154(b) by 281 days.

(21) Appl. No.: 14/091,056

(22) Filed: Nov. 26, 2013

(65) Prior Publication Data

US 2014/0153196 A1 Jun. 5, 2014

(30) Foreign Application Priority Data

Nov. 30, 2012 (JP) ................................. 2012-263421

(51) Int. Cl.
| H05K 7/00 | (2006.01) |
| H05K 1/18 | (2006.01) |
| H05K 3/28 | (2006.01) |
| H05K 3/34 | (2006.01) |

(52) U.S. Cl.
CPC .............. *H05K 1/181* (2013.01); *H05K 3/284* (2013.01); *H05K 3/3442* (2013.01); *H05K 3/3452* (2013.01); *H05K 2201/099* (2013.01); *H05K 2201/09118* (2013.01); *Y02P 70/611* (2015.11)

(58) Field of Classification Search
CPC ............. H05K 2201/096; H05K 2201/09872; H05K 1/0231; H05K 2924/01079
USPC .......... 361/760–765, 772–774; 174/258–264
See application file for complete search history.

(56) References Cited

U.S. PATENT DOCUMENTS

| 5,315,070 A | * | 5/1994 | Maiwald | ................ | H05K 3/303 |
| | | | | | 174/250 |
| 5,811,736 A | * | 9/1998 | Lauffer | ................... | H05K 1/112 |
| | | | | | 174/263 |
| 6,521,997 B1 | * | 2/2003 | Huang | ................ | H01L 23/3121 |
| | | | | | 174/255 |
| 6,998,532 B2 | * | 2/2006 | Kawamoto | ............. | H01L 24/16 |
| | | | | | 174/521 |
| 7,645,940 B2 | * | 1/2010 | Shepherd | ................ | H05K 1/114 |
| | | | | | 174/250 |
| 2003/0184986 A1 | * | 10/2003 | Soga | .................... | H05K 3/3452 |
| | | | | | 361/767 |
| 2006/0273461 A1 | | 12/2006 | Otsuka | | |

FOREIGN PATENT DOCUMENTS

| JP | 2004-014582 A | 1/2004 |
| JP | 2005-203616 A | 7/2005 |
| JP | 2006-339524 A | 12/2006 |
| JP | 2009-187999 A | 8/2009 |
| JP | 4341321 A | 10/2009 |
| JP | 2010-021192 A | 1/2010 |

* cited by examiner

*Primary Examiner* — Tuan T Dinh
(74) *Attorney, Agent, or Firm* — McGinn IP Law Group, PLLC

(57) ABSTRACT

An electronic module is provided with a circuit board 2, a chip component 3 surface-mounted on the circuit board 2 and a mold member 4 that seals the chip component 3. The circuit board 2 includes a land 7 and a resist pattern 8A that partially covers the land 7. The chip component 3 has a bottom electrode 6b and a side electrode 6c. The resist pattern 8A has an overlapped portion overlapped with the bottom electrode 6b of the chip component 3 in a planar view. A portion of the mold member 4 is filled at least in a first gap D1 between the resist pattern 8A and the first solder portion 10a.

17 Claims, 10 Drawing Sheets

MOUNTING STRUCTURE OF CHIP COMPONENT AND ELECTRONIC MODULE USING THE SAME

BACKGROUND OF THE INVENTION

1. Field of the Invention

The present invention relates to a mounting structure of a chip component, and more particularly relates to a mounting structure of a chip component to be installed in an electronic module having a mold structure. The present invention also relates to an electronic module using the mounting structure of a chip component.

2. Description of Related Art

In recent years, with increase in demand and multifunction for a mobile device such as a smartphone and a tablet computer, it has been required to downsize a component to be installed and to shorten the component in height. For this reason, there is an increasing demand for an electronic module product having intensive functions. A chip component to be installed in the electronic module needs to be mounted with a narrow pitch with a high density to meet the demand of downsizing the electronic module (see Japanese Patent Application Laid-open No. 2010-21192), and is required to exhibit high reliability when employing a mold structure or a shield structure.

A method of forming a solder fillet on a side surface of the chip component is generally known as a method of mounting a chip component. However, in the case of the mold structure and a combination of the mold structure and the shield structure, a method of forming a solder fillet on an inner side (an electrode) of the chip component with a partially formed solder resist below the chip component has been introduced in order to secure the reliability (See Japanese Patent No. 4341321).

However, in Japanese Patent No. 4341321, due to a small clearance between the top of the partially formed resist below the chip component and a body of the chip component, it is difficult to remove residual flux and to fill molding material, which may cause solder flash or peeling particularly in a reflow test after a water absorption process.

In most cases, only a land pattern for installing a component is formed on a surface layer of a ceramic-based substrate represented by an LTCC (Low Temperature Co-fired Ceramics), and no solder resist is formed on the surface layer. On the other hand, except for some substrates, a wiring pattern and an inter-land connection pattern as well as the land pattern for installing a component are formed on a surface of a resin-based substrate represented by a PCB (Printed Circuit Board). This is because a process of manufacturing the PCB employs a build-up process. From the aspect of cost, the number of processes, and thickness, these patterns are covered by the solder resist in most cases. However, in a structure of molding chip components mounted with a high density, particularly between the components, a portion covered by the solder resist is likely to cause a problem of peeling and cracking.

SUMMARY

The present invention has been achieved to solve the above problems, and an object of the present invention is to provide a mounting structure of a chip component having high reliability with which peeling and a cohesion failure of a mold member due to a difference in thermal expansion and a volatile residue at the time of reflow can be suppressed and generation of solder flash due to a re-melt of the solder can be suppressed. Another object of the present invention is to provide a downsized electronic module having high performance and high reliability, which includes such a mounting structure of a chip component.

In order to solve the above problems, a mounting structure of a chip component according to the present invention comprises a circuit board; a plurality of chip components surface-mounted on the circuit board; solders that electrically connect the chip components and the circuit board; and a mold member that seals the chip components, wherein the circuit board includes a wiring layer including a plurality of lands and a solder resist layer that selectively covers the wiring layer, the solder resist layer includes resist patterns that partially covers the lands, each of the chip components includes a bottom electrode parallel to a surface of the circuit board and a side electrode perpendicular to the surface of the circuit board, each of the solders electrically connects the bottom electrode and the side electrode and an exposed portion of the land, each of the resist patterns has an overlapped portion overlapped with the bottom electrode in a planar view, each of the solders has a first solder portion adhered to the side electrode and a second solder portion between the bottom electrode and the exposed portion of the land, and at least a first gap between the resist pattern and the first solder portion is the filled with the mold member.

According to the present invention, even when a plurality of chip components are mounted with a high density, peeling and a cohesion failure of the mold member due to thermal expansion at the time of reflow are hardly generated, and thus generation of solder flash can be suppressed. Particularly, a path connecting the first solder portion adhered to the side electrode and the second solder portion adhered to the bottom electrode (the land) is substantially cut off by the resist pattern, and thus the movement of the solder can be suppressed. Furthermore, because the chip component is configured to be mounted on the first resist pattern, a clearance of a predetermined size or larger, which is determined by a thickness of the resist, can be reliably secured below the chip, and thus flux cleaning and filling (underfill) of the mold member can be reliably performed. Therefore, a secondary damage due to a residual flux can be prevented from being generated, and the mold member can be reliably filled in a space that becomes a cause of solder flash.

In the present invention, it is preferable that a second gap between the overlapped portion of the resist pattern and the bottom electrode is further filled with the mold member. With this configuration, among the solders that connect a terminal electrode and the land, the first solder portion adhered to the side electrode and the second solder portion adhered to the bottom electrode are reliably separated from each other, and thus the first solder portion adhered to the side electrode becomes filletless. Therefore, the movement of the solder can be sufficiently suppressed.

In the present invention, it is preferable that a third gap between each of the chip components and the circuit board is filled with the mold member. With this configuration, a space that becomes a cause of solder flash can be reliably filled.

The mounting structure of chip components according to the present invention preferably further comprises a conductive film that covers a surface of the mold member. The conductive film can be a conductive film formed by plating, sputtering, evaporation, or adhesion of metal foil, or a coated film formed by applying conductive paste containing metal filler. This structure is to meet a demand for a self-shielded structure. However, moisture can hardly come out of the mold member at the time of heating, and thus the moisture is also vaporized and expanded due to heating at the time of reflow, causing generation of peeling and a cohesion failure of the mold member. However, such a problem can be prevented by to the above structure according to the present invention, which makes the effect of the present invention conspicuous.

In the present invention, the side electrode preferably includes a first side electrode formed on a first side surface of the chip component, and the overlapped portion includes a first strip pattern provided along the first side electrode. With this configuration, the path connecting the first solder portion adhered to the first side electrode and the second solder portion adhered to the bottom electrode (the land) can be cut off.

In the present invention, the side electrode preferably further includes second and third side electrodes respectively formed on second and third side surfaces of the chip component perpendicular to the first side surface, and the overlapped portion further includes a second strip pattern provided along the second side electrode and a third strip pattern provided along the third side electrode. With this configuration, the path connecting the first solder portion adhered to the first to third side electrodes and the second solder portion adhered to the bottom electrode (the land) can be cut off. That is, even when the terminal electrode includes a plurality of side electrodes, the path connecting the first solder portion adhered to the side electrodes and the second solder portion adhered to the bottom electrode (the land) can be cut off.

In the present invention, it is preferable that a distance between adjacent chip components is 500 µm or shorter. With this configuration, although a plurality of chip components can be mounted with a high density, it is likely to be influenced by a thermal expansion stress, and thus peeling and a cohesion failure of a resin member such as the mold member and the solder resist are likely to be generated. However, the above configuration according to the present invention can secure a bonding area of the resin member more than a conventional structure, and thus such a problem can be prevented, which makes the effect of the present invention conspicuous.

In order to solve the above problems, an electronic module according to the present invention comprises a circuit board including a main surface, a land electrode formed on the main surface and a resist pattern having an overlapped portion that covers the land electrode; a chip component mounted on the main surface of the circuit board, the chip component including a bottom electrode substantially parallel to the main surface of the circuit board and a side electrode substantially perpendicular to the main surface of the circuit board; a solder electrically connecting the bottom and side electrodes of the chip component to the land electrode of the circuit board, the solder including a first solder portion adhered to the side electrode and a second solder portion provided between the bottom electrode and the land electrode; and a mold member formed on the main surface of the circuit board so as to seal the chip component, the mold member having a first portion filling a first gap between the overlapped portion and the first solder portion. According to the present invention, an electronic module with a compact size, high performance, and high reliability can be provided.

In the present invention, it is preferable that the mold member further having a second portion filling a second gap between the overlapped portion and the bottom electrode.

In the present invention, it is preferable that the chip component further includes a bottom surface having a first exposed portion being free from the bottom electrode, the main surface of the circuit board includes a second exposed portion being free from the land electrode, and the mold member further having a third portion filling a third gap between the first and second exposed portions.

The electronic module according to the present invention preferably further comprises a conductive film that covers an outer surface of the mold member.

In the present invention, it is preferable that the chip component further includes a first side surface substantially perpendicular to a longitudinal direction of the chip component, the side electrode includes a first side electrode formed on the first side surface, and the first portion of the mold member is provided at least between the overlapped portion and the first solder portion adhered to the first side electrode.

In this case, it is more preferable that the chip component further includes second and third side surfaces substantially parallel to the longitudinal direction of the chip component, the side electrode further includes a second side electrode and a third side electrode respectively formed on a second side surface and a third side surface, and the first portion of the mold member is further provided between the overlapped portion and the first solder portion adhered to the second and third side electrodes.

According to the present invention, peeling and a cohesion failure of the module member due to thermal expansion at the time of reflow is suppressed, and thus a mounting structure of a chip component having high reliability can be provided, in which the generation of solder flash due to re-melt of the solder is suppressed. In addition, according to the present invention, an electronic module with a compact size, high performance, and high reliability can be provided, which includes the mounting structure of the above chip component.

According to the present invention, a cohesion area between different members such as the mold member and the solder resist between the chip components mounted with a high density can be secured wider than the conventional case. Furthermore, a clearance of a predetermined size or larger can be reliably secured below the chip component, and thus the resin can be reliably filled in the clearance. By implementing these two aspects in the same structure, an electronic module with high productivity, compact size, high performance, and high reliability can be provided.

BRIEF DESCRIPTION OF THE DRAWINGS

The above and other objects, features and advantages of this invention will become more apparent by reference to the following detailed description of the invention taken in conjunction with the accompanying drawings, wherein:

FIG. 6A is a side cross-sectional view along a line X-X' shown in FIG. 5B, and FIG. 6B is a side cross-sectional view along a line Y-Y' shown in FIG. 5B;

DETAILED DESCRIPTION OF THE EMBODIMENTS

Preferred embodiments of the present invention will be described in detail below with reference to the accompanying drawings.

Figure 1:
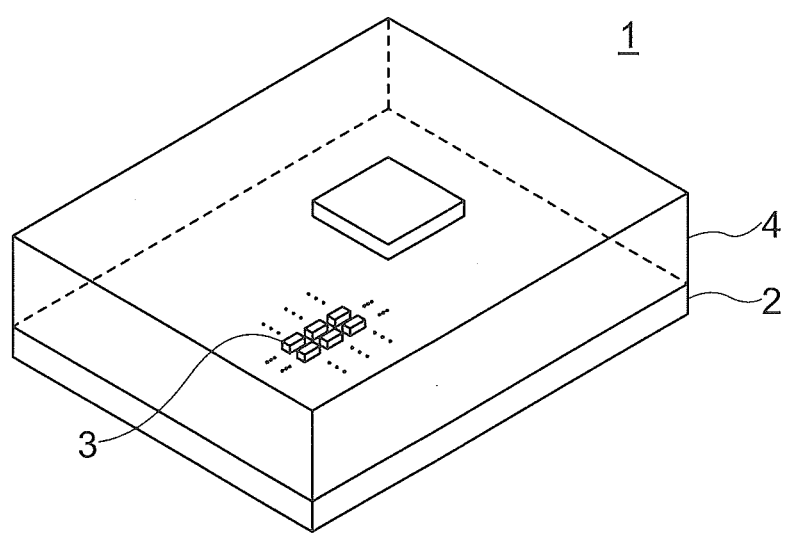
FIG. 1 is a schematic perspective view showing a structure of an electronic module according to a first embodiment of the present invention.

FIG. 1 is a schematic perspective view showing a structure of an electronic module according to the first embodiment of the present invention.

As shown in FIG. 1, an electronic module 1 includes a circuit board 2 and an IC chip and other chip components 3 mounted on the circuit board 2. The chip components 3 are surface-mounted on a main surface of the circuit board 2 and sealed by a mold member 4 to electrically and mechanically protect a mounted circuit.

Figure 2:
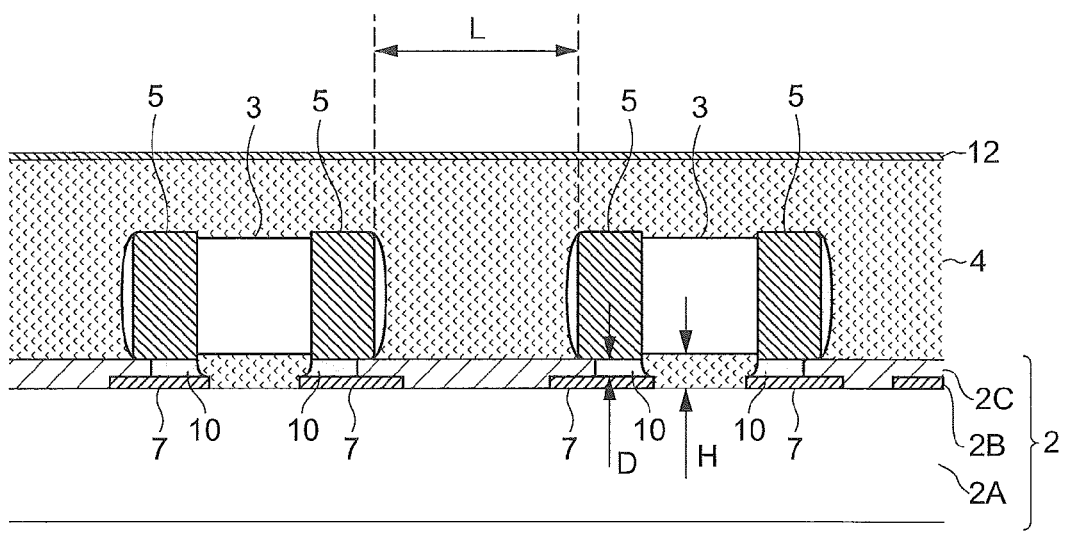
FIG. 2 is a schematic side view of a mounting structure of the chip components 3.

FIG. 2 is a schematic side view of a mounting structure of the chip components 3.

As shown in FIG. 2, a plurality (two in this example) of chip components 3 is closely mounted on the circuit board 2. Mounting closely means that the chip components are mounted such that a distance (a pitch) L between adjacent chips is very short, which is a technique employed when mounting minute chip components with a high density. Although it depends on the chip size, the chip direction, and the shape of the land (land electrode), the distance L between the chip components in close mounting is 500 μm or shorter, preferably 300 μm or shorter, and further preferably 200 μm or shorter. Although it is not particularly limited, the chip size can be from 4532 (4.5 mm×3.2 mm×3.2 mm) to 0402 (0.4 mm×0.2 mm×0.2 mm).

The circuit board 2 includes a base member 2A, a wiring layer 2B positioned on a surface of the base member 2A, and a solder resist layer 2C that selectively covers the wiring layer 2B. Preferably, the circuit board 2 is an organic board such as a PCB that generally includes the solder resist layer 2C on a surface layer as a standard, but can be a ceramic board such as an LTCC. The circuit board 2 can be either a single-layer board or a multi-layer board or can be a part-embedded board.

A wiring pattern and a connection pattern between the lands of the wiring layer 2B are electrically and mechanically protected by being covered by the solder resist layer 2C. The solder resist layer 2C prevents a solder from being adhered to an unnecessary portion when mounting a component, and at the same time, protects the wiring pattern from dust, heat, moisture, and the like, thereby realizing a function of a protective film for maintaining electrical insulation. Material used in a PCB and a package board can be appropriately selected as a solder resist material, and further, the solder resist layer 2C can be appropriately configured with a dry film or a paste-type material by a known process such as laminating, spraying, and printing.

The wiring layer 2B includes a plurality of lands 7, and terminal electrodes 5 of the chip component 3 are connected to the respective lands 7 via a solder 10. An opening portion is provided above the land 7, from which the solder resist layer 2C is selectively removed, and the terminal electrode 5 and the land 7 are electrically and mechanically connected to each other via the solder 10 inside the opening portion. Soldering is performed by a reflow process employing a lead-free solder paste. In order to achieve the close mounting, it is preferred that fillet size of the solder (an amount of solder protrusion on a component terminal side after soldering) is as small as possible.

Although the details are described later, the chip component 3 is mounted on an upper surface of the solder resist layer 2C, so that a gap D is formed between a bottom surface of the terminal electrode 5 of the chip component 3 and an upper surface of the land 7. The gap D is as wide as the thickness of the solder resist layer 2C interposed between the terminal electrode 5 and the land 7 or slightly wider. After the reflow process, the chip component may be lifted due to a surface tension of the solder, and in this case, the gap D is slightly wider than the thickness of the solder resist layer 2C.

The mold member 4 is made of epoxy resin containing filler, for example. The mold member 4 can be formed by any one of transfer, compression, printing, laminating, and cast molding. Among those, the transfer molding employing a tablet resin, which enables molding with a low material cost and a short takt time, or the compression molding employing a granulated powder resin is effective. In order to meet a demand for a self-shield structure of a module, the surface of the mold member 4 can be coated with a conductive film 12. The conductive film 12 can be formed by plating or conductive paste.

FIGS. 3A to 3D are schematic plan views of various high-density mounting layouts of the chip components 3.

Figure 3A:
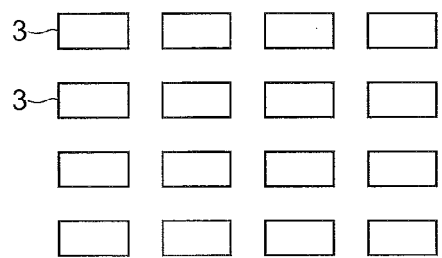
FIGS. 3A to 3D are schematic plan views of various high-density mounting layouts of the chip components 3.
Figure 3B:
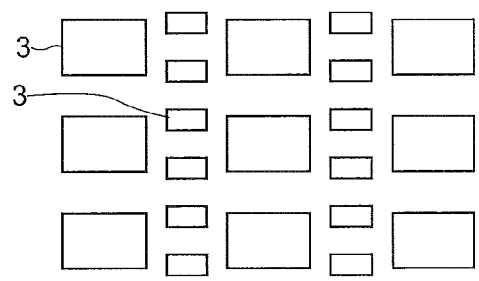
Figure 3C:
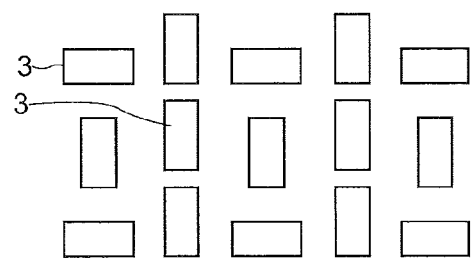
Figure 3D:
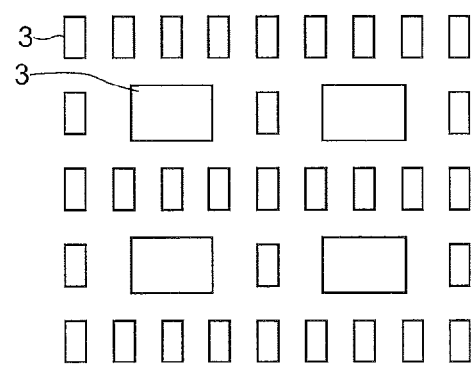

FIG. 3A shows a case where the adjacent chip components 3 have the same size and face the same direction. FIG. 3B shows a case where the adjacent chip components 3 have different sizes but face the same direction. FIG. 3C shows a case where the adjacent chip components 3 have the same size but the directions are perpendicular to each other. FIG. 3D shows a case where the adjacent chip components 3 have different sizes and the directions are perpendicular to each other. In FIGS. 3A to 3D, only the chip components are shown and the lands are omitted from the drawings. However, a connection layout between the lands is not particularly limited. That is, it suffices that the adjacent chip components 3 are electrically connected via the wiring pattern or insulated from each other. Although the layout of the chip components 3 varies in this manner, because the chip components 3 are closely mounted in any case, a large stress is likely to be generated at the time of thermal expansion of the mold member 4. However, when the mounting structure of chip components according to the embodiment is employed, various problems caused by the generation of such stress can be resolved.

Figure 4A:
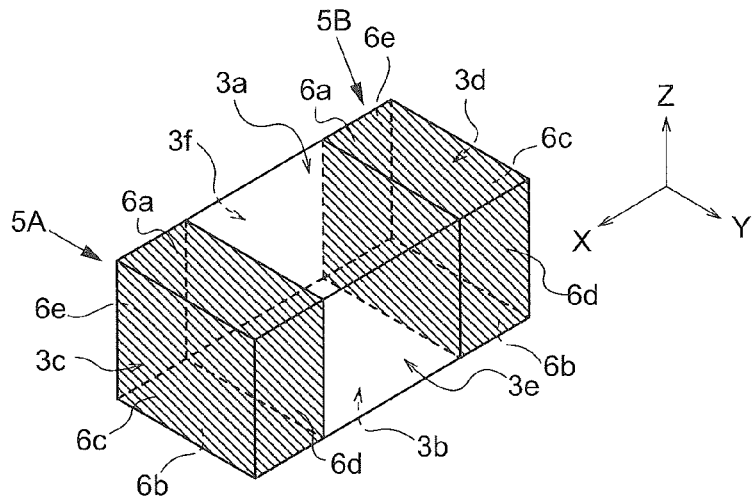
FIGS. 4A to 4C are schematic perspective views of various terminal electrode structures of the chip component 3.
Figure 4B:
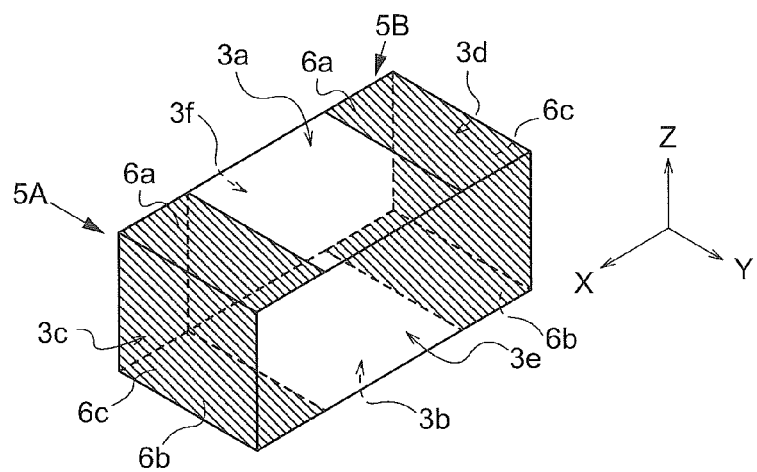
Figure 4C:
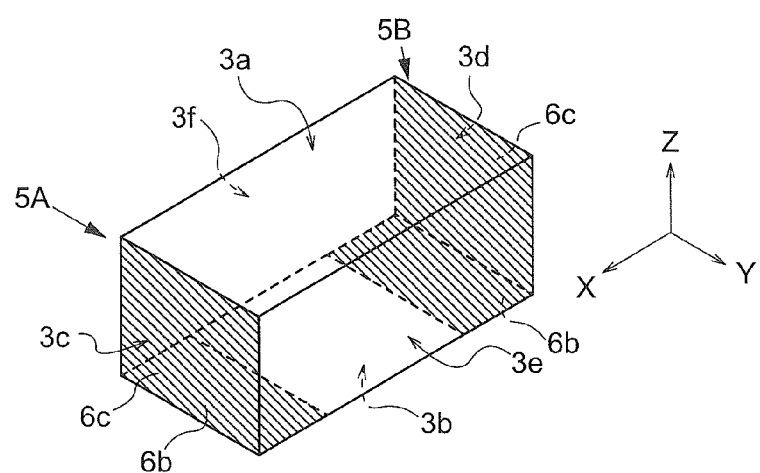

FIGS. 4A to 4C are schematic perspective views of various terminal electrode structures of the chip component 3.

As shown in FIGS. 4A to 4C, an outer shape of the chip component 3 is a rectangular parallelepiped, including an upper surface 3a, a bottom surface 3b, two side surfaces (end surfaces) 3c and 3d perpendicular to a longitudinal direction (an X direction) of the rectangular parallelepiped, and two side surfaces 3e and 3f parallel to the longitudinal direction of the rectangular parallelepiped. The chip component 3 is a surface-mounting component having a two-terminal structure, including terminal electrodes 5A and 5B on respective end portions in the longitudinal direction. For example, the chip component 3 having the two-terminal structure includes a passive component such as a chip resistor, an inductor, a capacitor, a thermistor, and an impeder.

The terminal electrodes 5A and 5B of the chip component 3 shown in FIG. 4A have a five-surface electrode structure, including electrode surfaces 6a to 6e on the upper surface 3a, the bottom surface 3b, and three side surfaces 3c (or 3d), 3e, and 3f of the chip. The terminal electrodes 5A and 5B of the chip component 3 shown in FIG. 4B have a three-surface electrode structure (a U-shaped electrode structure), including the electrode surfaces 6a to 6c on the upper surface 3a, the bottom surface 3b, and one side surface 3c (or 3d). The terminal electrodes 5A and 5B of the chip component 3 shown in FIG. 4C have a so-called two-surface electrode structure (an L-shaped electrode structure), including the electrode surfaces 6b and 6c on the bottom surface 3b and one side surface 3c (or 3d). Although it is not particularly limited, the terminal electrodes 5A and 5B can be formed by applying a conductive paste containing silver or copper as a main component on both end portions of the component main body and performing a baking process at a temperature of about 800° C. In this case, the terminal electrodes 5A and 5B become a round chamfered shape. For example, when the electrodes are formed by a sputter, the round is reduced to have an electrode shape along a chip body.

All the chip components 3 have a vertically symmetric shape as viewed from a plane perpendicular to the longitudinal direction or a rotationally symmetric (twofold symmetric) shape with reference to a center axis passing through centers of the upper surface and the bottom surface of the chip component 3, and the terminal electrodes 5A and 5B have substantially the same shape.

The chip components 3 shown in FIGS. 4A to 4C are mounted on the circuit board 2 by the reflow process, and the terminal electrodes 5A and 5B are soldered on the lands on the circuit board 2. A land pattern of a mounting area of the chip components 3 is explained in detail below.

Figure 5A:
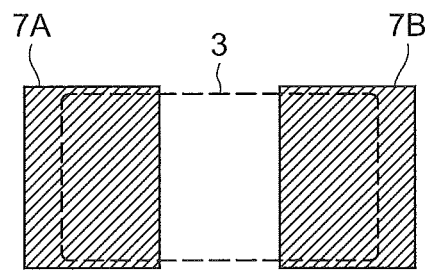
FIGS. 5A to 5C are schematic plan views of a land pattern layout on the circuit board 2, which is a pattern layout of the mounting area of the chip component 3 having a five-surface electrode structure shown in FIG. 4A.
Figure 5B:
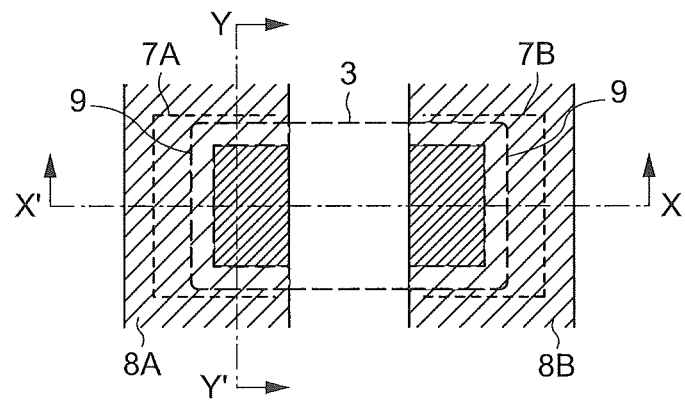
Figure 5C:
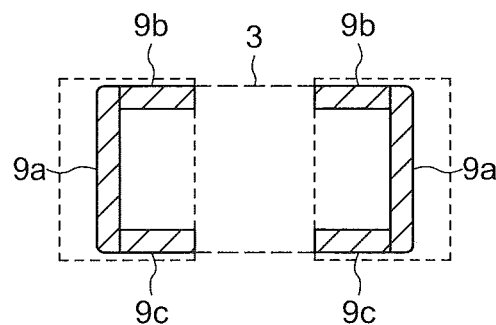

FIGS. 5A to 5C are schematic plan views of a land pattern layout on the circuit board 2, which is a pattern layout of the mounting area of the chip component 3 having a five-surface electrode structure shown in FIG. 4A. FIG. 5A shows the lands alone, FIG. 5B shows the lands and the resist pattern in an overlapped manner, and FIG. 5C shows an extracted portion of the resist pattern (an overlapped portion).

As shown in FIG. 5A, a pair of lands 7A and 7B corresponding to the pair of terminal electrodes 5A and 5B of the chip component 3 are provided on the main surface of the circuit board 2. The lands 7A and 7B are rectangular patterns each having an area wider than that of the terminal electrodes 5A and 5B in a planar view.

As shown in FIG. 5B, resist patterns 8A and 8B that constitute the solder resist layer 2C are formed on the upper layers of the lands 7A and 7B, and the resist patterns 8A and 8B limit the effective area of the lands. The resist pattern 8A partially covers an outer side of the land 7A in a planar view, and the resist pattern 8B partially covers an outer side of the land 7B in a planar view. The "outer side" and the "inner side" of the land are defined with reference to a mounting position of the chip component, and with respect to the longitudinal direction (an X direction) of the chip component, a direction heading for the side surfaces 3c and 3d of the chip component is the outer side, and a direction heading for a center portion of the chip component in a longitudinal direction is the inner side. Furthermore, with respect to a width direction (a Y direction) of the chip component, a direction heading for the side surfaces 3e and 3f of the chip component is the outer side, and a direction heading for a center portion of the chip component in the width direction is the inner side.

On the other hand, the inner sides of the lands 7A and 7B are exposed without being covered by the resist patterns 8A and 8B. The terminal electrodes 5A and 5B of the chip component 3 are respectively soldered on the exposed surfaces of the lands 7A and 7B.

Each of the resist patterns 8A and 8B includes an overlapped portion 9 overlapped with the bottom electrode 6b of the chip component 3 in a planar view. FIG. 5C shows the extracted overlapped portion 9, where the overlapped portion 9 is a U-shaped pattern formed with a constant width along three sides of the outer side of the land 7A. That is, the overlapped portion 9 includes a combination of a first mask pattern 9a provided along a long side of the outer side of the land 7A and second and third mask patterns 9b and 9c respectively provided along two short sides. Although it is preferable that the first to third mask patterns 9a to 9c are strip-shaped, it is not strictly a strict strip shape. The first to third mask patterns 9a to 9c can have the same width or different widths. The configuration of the resist pattern 8B is the same as that of the resist pattern 8A.

As described above, outer circumferential portions of the lands 7A and 7B are selectively overcoated by the solder resist, and by placing the bottom electrode 6b of the chip component 3 on the solder resist, a height H of a clearance (the third gap) between the bottom surface (a first exposed surface) of the chip component 3 that is free from the bottom electrode and an exposed surface (a second exposed surface) of the circuit board 2 that is not covered by lands and solder resist (see FIG. 2) is sufficiently secured. Although it depends on the size of the filler of the mold member 4, the height H of the clearance is preferably 10 μm to 70 μm and further preferably 25 μm to 70 μm.

Figure 6A:
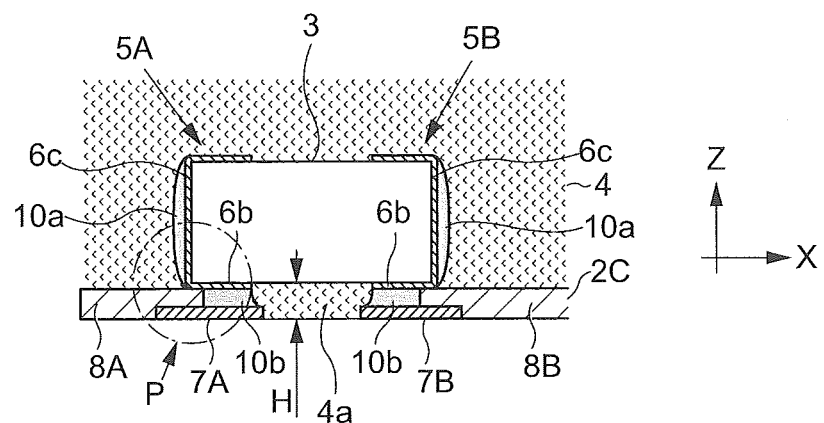
FIGS. 6A and 6B show a state where the chip component 3 is mounted, where
Figure 6B:
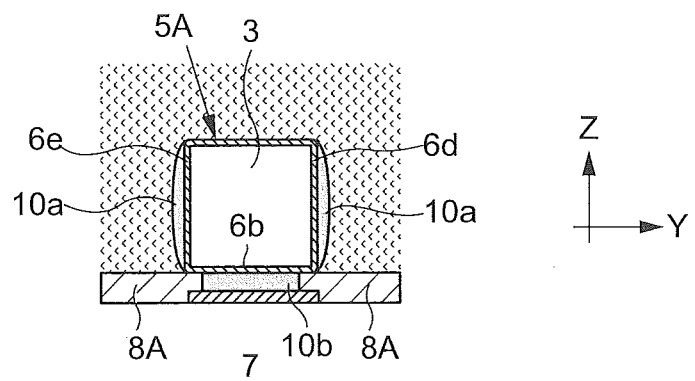
Figure 7:
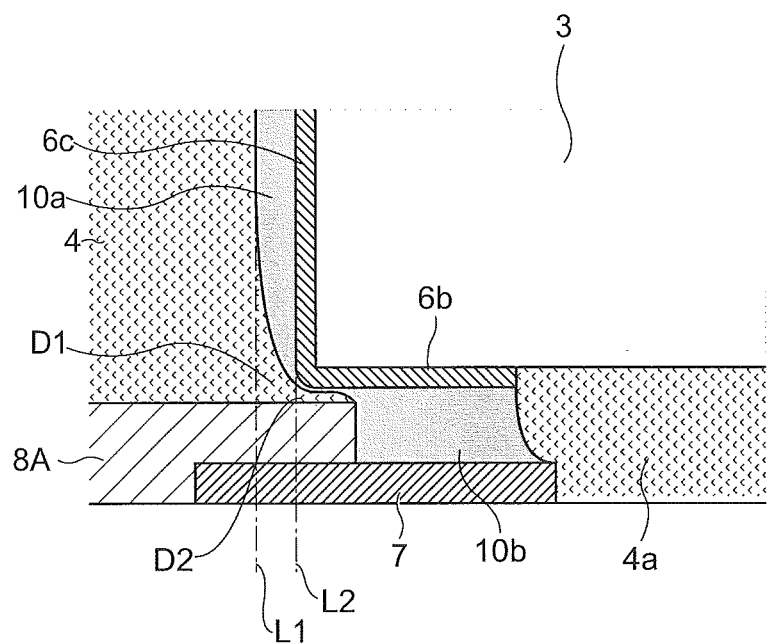
FIG. 7 is an enlarged view of a portion P (a solder bonding portion) shown in FIG. 6A.

FIGS. 6A and 6B show a state where the chip component 3 is mounted, where FIG. 6A is a side cross-sectional view along a line X-X' shown in FIG. 5B, and FIG. 6B is a side cross-sectional view along a line Y-Y' shown in FIG. 5B. FIG. 7 is an enlarged view of a portion P (a solder bonding portion) shown in FIG. 6A.

As shown in FIG. 6A, end portions of the resist patterns 8A and 8B extend from the outer side of the land 7 toward the inner side, thus overcoating the land 7 and include the overlapped portion 9 overlapped with the terminal electrodes 5A and 5B of the chip component 3 in a planar view. The end portions of the resist patterns 8A and 8B intervene between the bottom electrode 6b and the land 7 and come in contact with the bottom electrode 6b as seen macroscopically.

The chip component 3 is mounted on the lands 7A and 7B, and the terminal electrodes 5A and 5B are respectively connected to the lands 7A and 7B via a second solder portion 10b. Preferably, such an amount of a cream solder is supplied to the lands 7A and 7B that a volume of the solder after being melted is larger than a space having a height that is regulated by the resist patterns 8A and 8B. This makes the height H of the clearance constantly be a total thickness of the respective lands 7A and 7B and the respective resist patterns 8A and 8B, and thus a portion 4a of the mold member 4 is reliably filled inside the clearance below the chip.

As shown in FIG. 7, a portion of the mold member 4 is filled in a gap (the first gap) D1 between a first solder portion 10a and an upper surface of the resist pattern 8A, having a portion overlapped with the first solder portion 10a in a planar view. When a virtual line L1 is drawn perpendicularly from an outermost end surface of the first solder portion 10a to the circuit board 2, the portion of the mold member 4 and the resist pattern 8A penetrate into the inner side of the land 7 from the virtual line L1. Preferably, the portion of the mold member 4 further penetrates into the inner side. That is, it is preferable that the portion of the mold member 4 is filled in a gap (the second gap) D2 between the upper surface of the resist pattern 8A and the bottom electrode 6b of the chip component 3, including a portion overlapped with the bottom electrode 6b of the chip component 3 in a planar view. When a virtual line L2 is perpendicularly drawn from the side electrode 6c of the chip component 3 to the circuit board 2, the portion of the mold member 4 and the resist pattern 8A penetrate into the inner side of the land 7 from the virtual line L2. Particularly, when the side electrode 6c of the chip component has R (curvature), the virtual line L2 is drawn from the outermost side (the end portion of the electrode that defines the maximum external dimension of the component).

The bottom electrode 6b and the side electrode 6c of the chip component 3 are bonded by the solder 10 being wet. However, because the solder 10 is insufficiently wet, only a small amount or no solder adheres to the surface of the resist pattern 8A. Furthermore, because the resist pattern 8A extends to the inner side from the virtual lines L2 and L1, the mold member 4 is filled in the gaps D1 and D2 that are formed because the solder is not adhered to the resist.

With this configuration, among the solders that connect the terminal electrode 6 and the land 7, the first solder portion 10a adhered to the side electrode 6c and the second solder portion 10b adhered to the bottom electrode 6b are substantially separated from each other, and thus the first solder portion 10a adhered to the side electrode 6c becomes filletless. The same holds true for the resist pattern 8B.

As shown in FIG. 6B, the first solder portion 10a is also adhered to the side electrodes 6d and 6e respectively formed on the side surfaces 3e and 3f of the chip component 3. However, in the same manner as the side electrode 6c, the first solder portion 10a and the second solder portion 10b are substantially separated from each other by the overlapped portion 9 of the resist pattern.

Figure 8:
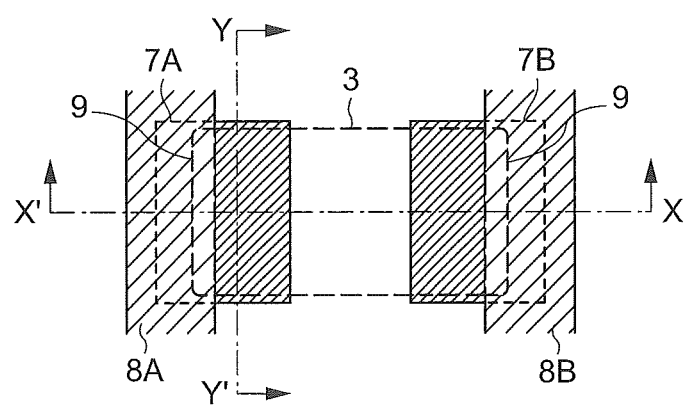
FIG. 8 shows a pattern layout of mounting positions of the chip components 3 shown in FIGS. 4B and 4C.

FIG. 8 shows a pattern layout of mounting positions of the chip components 3 shown in FIGS. 4B and 4C.

As shown in FIG. 8, the resist pattern 8A is provided with a constant width in an overlapped manner along one side of the outer side of the land 7A, selectively covering the outer circumferential portion of the land 7A. That is, the resist pattern 8A only includes the first mask pattern 9a provided along the long side of the outer side of the land 7. The same holds true for the resist pattern 8B.

As explained above, in the mounting structure of the chip component 3 according to the embodiment, the resist patterns 8A and 8B respectively overcoat the outer side portions of the lands 7A and 7B, portions of the resist patterns 8A and 8B include the overlapped portion 9 overlapped with the end portion (the bottom electrode 6b) of the chip component 3 mounted on the land in a planar view, the solder 10 includes the first solder portion 10a adhered to the side electrodes 6c, 6d, and 6e and the second solder portion 10b positioned between the bottom electrode 6b and the exposed portion of the land 7, and a portion of the mold member 4 is filled in the gap between the overlapped portion 9 and the solder lifted to the side electrode 6c and the bottom electrode 6b. Therefore, the total thickness of the land 7 and the resist pattern 8 or larger can be always secured as the clearance below the chip, by which the flux can be completely removed by a simplified flux cleaning process, and the filling of the mold member (particularly a transfer mold and a compression mold) can be reliably performed.

Furthermore, because it is easy to secure the clearance below the chip, it is not necessary to cut the filler of the mold member further finely, leading to reduction in cost of the material. Further, because it is not necessary to apply high pressure to fill the mold member in the narrow clearance below the chip, a low-pressure molding can be performed, and thus, even molding of a product that has low tolerance for stress generates less defect. Therefore, a higher quality module can be provided with a low cost in a reliability test and a customer mounting reflow resistance.

In the present embodiment, the first solder portion positioned on a side of the side electrode and the second solder portion positioned on a side of the bottom electrode are separated from each other by the solder resist, and thus the solder hardly moves from the side of the side electrode to the side of the bottom electrode, a floating stress of a component due to solder melting flow and a peeling stress of the mold member and the solder resist can be suppressed. Furthermore, due to expansion of the mold member, the solder resist presses the land, and thus sufficient cohesion strength can be maintained with respect to the generated stress to prevent the solder resist and the land from peeling. Therefore, a module with higher reliability can be provided.

In the present embodiment, because the solder becomes filletless, a cohesion range of the mold member and the board surface (the solder resist) can be increased, which increases a limit value with respect to the stress at the time of reflow, and thus the chip components can be mounted with a narrower pitch. In addition, due to the close mounting, a module having the same function can be achieved with a smaller mounting area. These effects are considerably effective for a mobile device such as a smartphone in which an area for a main board cannot be sufficiently secured due to a need for a large capacity battery. Furthermore, because the number of products obtained from a board of the same size can be increased, it contributes to cost reduction.

Although a structure without molding becomes a double-layer structure such as "board member+resist member", the mold structure according to the present embodiment becomes a three to four-layer structure such as "board member+resist member+mold member" and "board member+wiring pattern+resist member+mold member". In this case, a defect may be generated between all layers, and thus, defect probability increases. As a countermeasure, it can be considered to use a solder that is not melted in reflow, to use a bonding material other than the solder, or to make all layers have an equivalent physical property. However, it is considerably difficult to actually implement any one of these options, considering restriction on material, cost, mounting yield, connection reliability, and an obtainable range of a physical property. Therefore, it is considerably effective to reduce the stress and to increase the cohesion force from the structure aspect, as in the present invention.

When employing a shielded structure, moisture can hardly come out of the mold member, and thus the moisture is also vaporized and expanded due to heating at the time of reflow. This causes a further increase of the stress due to the thermal expansion of the mold member, so that peeling or a cohesion failure of the mold member is generated, making the problem of solder flash conspicuous. However, according to the present embodiment, even with the same distance between the components, the cohesion strength (distance) between the mold member and the board member (the resist)

between the components can be further secured, and thus the above problems can be greatly reduced.

It is apparent that the present invention is not limited to the above embodiments, but may be modified and changed without departing from the scope and spirit of the invention.

Figure 9:
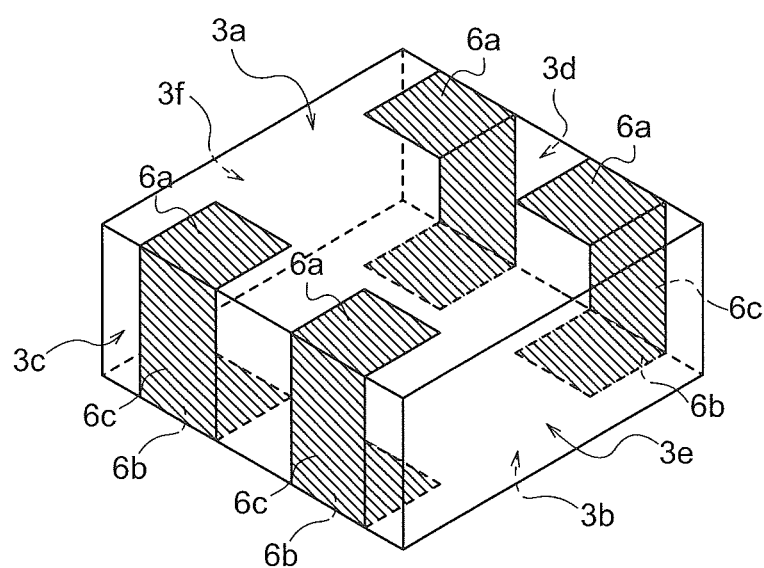
FIG. 9 is a schematic perspective diagram showing another variation of the chip component 3.

For example, although the surface-mounting chip component having a two-terminal structure is described in the above embodiment, the present invention is not limited to the chip component having the two-terminal structure but can be applied to various chip components having an electrode structure causing a side fillet of the solder, such as a four-terminal structure shown in FIG. 9 and an arrayed-terminal structure. However, the chip component having the two-terminal structure is mounted in a larger number as compared to the chip component having the four-terminal structure or the arrayed-terminal structure, and the chip size of the chip component having the two-terminal structure is smaller than those of the other types. Therefore, the close mounting is strongly demanded for the chip component having the two-terminal structure, and the effect of the present invention is more conspicuous for the chip component having the two-terminal structure.

EXAMPLES

Example 1

A wiring layer including a land was formed by performing patterning based on a subtractive method using R-1515B manufactured by Panasonic Corporation (thickness t=0.2 mm) as an organic board material (PCB). Subsequently, a surface of the land was treated by a Cu-OSP (Organic Solderability Preservative) (SHIKOKU CHEMICALS CORPORATION) by laminating, exposing, developing, and post curing, using PFR®-800 AUS®410 manufactured by TAIYO INK MFG. CO., LTD. as a solder resist. Two types of patterns including one (a structure of the Example) in which the land and the resist pattern are formed as shown in FIGS. 5A to 5C and another (a conventional structure) in which the entire surface of the land is exposed were fabricated.

Subsequently, M705 cream solder, which is Sn/Ag/Cu-based solder manufactured by Senju Metal Industry Co., Ltd., was printed on the board material mentioned above, chip components having sizes of 0603 to 2520 were mounted at a mounter, and the chip components were bonded to the board by a reflow process at the maximum temperature of 260° C. Thereafter, the mounting state of the chip components was observed with a magnification microscope. In addition, a cross section of the chip component was polished to observe the state of the cross section.

As a result, in the chip component having the structure of the Example, it was found that the solder became filletless, so that the cohesion range of the mold member and the board was widened even with the same distance between the components. On the other hand, in the chip component having the conventional structure (a comparative example), it was found that the solder had a fillet. When the solder has a fillet, an amount of the solder that is pressed by thermal expansion of the mold member is large, and peeling of the mold member or floating of the component is likely to be generated. However, in a filletless structure, the amount of the solder that is pressed by thermal expansion of the mold member is small, and thus peeling of the mold member or floating of the component is hardly generated, and the generation of solder flash can be suppressed.

Subsequently, a clearance below a chip after polishing the cross section was measured with a toolmaker's microscope. The result of measurement is shown in FIG. 10.

Figure 10:
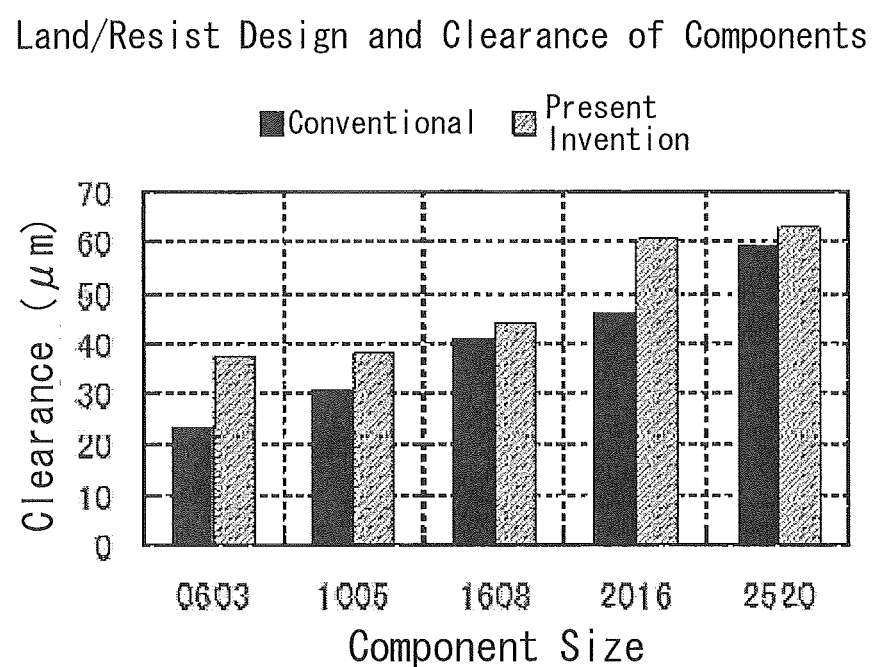
FIG. 10 is a graph showing a result of measurement of a clearance (a standoff) below a chip after polishing the cross section.

As is clear from FIG. 10, in the chip components having a size of 1005 or larger, a clearance of 30 μm or larger was secured in both the Example and the comparative example. However, in minute chip components having a size of 0603, it was found that only the Example exhibited the clearance of 30 μm or larger, and the clearance of the comparative example was smaller than 30 μm.

Example 2

A mold process was performed on the chip components having sizes of 0603 to 3216 by a compression molding method, and post curing was performed under a predetermined curing condition. CV8710TAC (filler 30 μm cut, average size=6 μm) manufactured by Panasonic Corporation was used as the mold member, and molding was performed under a manufacturer recommended condition (molding pressure=5 MPa). Further, the cross section of the molded product was polished to observe the state of the cross section. The result of observation is shown in Table 1.

TABLE 1

| Land pattern | Chip size | No problem | Residual flux | Mold member insufficient filling |
|---|---|---|---|---|
| Comparative Example | 0603 | 292/300 | 3/300 | 5/300 |
|  | 1005 | 197/200 | 2/200 | 2/200 |
|  | 1608 | 180/180 | 0/180 | 0/180 |
|  | 2012 | 120/120 | 0/120 | 0/120 |
|  | 3216 | 80/80 | 0/80 | 0/80 |
| Example | 0603 | 300/300 | 0/300 | 0/300 |
|  | 1005 | 300/300 | 0/300 | 0/300 |
|  | 1608 | 180/180 | 0/180 | 0/180 |
|  | 2012 | 120/120 | 0/120 | 0/120 |
|  | 3216 | 80/80 | 0/80 | 0/80 |

As shown in Table 1, in the case of the Example, it was found that the clearance of 30 μm or larger is secured, so that there is no residual flux, and the mold member is sufficiently filled in the clearance below the chip. On the other hand, in the comparative example, it was found that a defect was generated in the chip components having a size of 1015 or smaller, and the number of defects increased as the chip size decreased.

Example 3

A plurality of chip components having sizes of 0603 to 3216 were arranged with the distance between the components selected from 150 μm, 200 μm, and 250 μm, the chip components were mounted by reflow, and after molding, the board was diced to a size of 10 mm×10 mm, to complete samples of the electronic module. Materials and process conditions used were the same as mentioned above. The sample was then placed under a moisture absorption condition of MSL-2a defined by IPC/JEDEC J-STD-020D.1, and after passing the sample through a reflow furnace at the maximum temperature of 260° C. three times, the cross section was observed to confirm any defect in the mounting. The checking result is shown in Tables 2 to 4.

TABLE 2

Mounting configuration: Single

| | Peeling/Cohesion failure | | Solder flash | |
|---|---|---|---|---|
| Chip size | Example | Comparative Example | Example | Comparative Example |
| 0603 Size (n = 300) | 0/300 | 1/300 | 0/300 | 1/300 |
| 1005 Size (n = 200) | 0/200 | 1/200 | 0/200 | 0/200 |
| 1608 Size (n = 180) | 0/180 | 1/180 | 0/180 | 1/180 |
| 2012 Size (n = 120) | 0/120 | 7/120 | 0/120 | 5/120 |
| 3216 Size (n = 80) | 0/80 | 15/80 | 0/80 | 9/80 |

TABLE 3

Mounting configuration: In-line arrangement

| | | Peeling/Cohesion failure | | Solder flash | |
|---|---|---|---|---|---|
| Distance between components | Chip size | Example | Comparative Example | Example | Comparative Example |
| 150 μm (n = 10) | 0603-1005 | OK | OK | OK | OK |
| | 0603-1608 | OK | OK | OK | OK |
| | 1005-1608 | OK | NG | OK | NG |
| 250 μm (n = 10) | 0603-2012 | OK | NG | OK | OK |
| | 1005-2012 | OK | NG | OK | OK |
| | 1608-2012 | OK | NG | OK | NG |
| | 2012-3216 | OK | NG | OK | NG |

TABLE 4

Mounting configuration: Orthogonal arrangement

| | | Peeling/Cohesion failure | | Solder flash | |
|---|---|---|---|---|---|
| Distance between components | Chip size | Example | Comparative Example | Example | Comparative Example |
| 150 μm (n = 10) | 0603-1005 | OK | OK | OK | OK |
| | 0603-1608 | OK | NG | OK | OK |
| | 1005-1608 | OK | NG | OK | NG |
| 250 μm (n = 10) | 0603-2012 | OK | NG | OK | OK |
| | 1005-2012 | OK | NG | OK | NG |
| | 1608-2012 | OK | NG | OK | NG |
| | 2012-3216 | OK | NG | OK | NG |

In Table 2, n represents the number of chips in the module. The reason why the number n is different for each chip size is because the number of chips that can be mounted in a constant area is decreased as the chip size is increased. "Serial between components" in Table 3 means the layout shown in FIG. 3A or 3B, "90 degrees between components" in Table 4 means the layout shown in FIG. 3C or 3D. For example, "serial between components (150 μm), 0603 to 1005" means that the chip components having a size of 0603 and the chip components having a size of 1005 are mounted on the board of 10 mm×10 mm such that the terminals of the chip components face each other and the distance between the components becomes 150 μm, and one of the modules becomes the unit of n.

"OK" and "NG" in Tables 3 and 4 were evaluated in the following manner. A plurality of pairs of chip components exists in a single module. However, when there is a defect in even one pair among the pairs of chip components, the entire module becomes defective, which is designated as "NG". On the contrary, when there is no defect at all, it is designated as "OK".

As is clear from Tables 2 to 4, in the mounting structure of the chip components according to the Example, it is confirmed that peeling and a cohesion failure of the mold member are resolved after water absorption reflow. On the other hand, in the mounting structure of the chip components according to the comparative example, it was confirmed that the defect probability increases as the distance between the components decreases.

In the mold reliability test mentioned above, it was found that a defect is likely to be generated as the chip size increases. The reason why a defect is generated when the chip size is large is different from that of the case where the chip size is small. In the chip components having a size of 1005 or smaller, a defect is generated due to insufficient cleansing or insufficient filling. However, in the chip components having a size of 1608 or larger, a defect is generated due to its outer shape. A larger component has a larger amount of solder for mounting the component, and is likely to be influence by "a volume expansion stress and solder flow" due to melting of the solder. Furthermore, because the mold resin is adhered with respect to a relatively wide component area, it is likely to be influenced by a shear (peeling) stress due to a thermal expansion difference of the member. According to the present invention, a defect generated by different factors of large and small components can be resolved with a single structure, thereby exhibiting an excellent effect.

What is claimed is:

1. An electronic module comprising:
a circuit board including a main surface, a land electrode formed on the main surface and a resist pattern having an overlapped portion that covers the land electrode;
a chip component mounted on the main surface of the circuit board, the chip component including a bottom electrode substantially parallel to the main surface of the circuit board and a side electrode substantially perpendicular to the main surface of the circuit board;
a solder electrically connecting the bottom and side electrodes of the chip component to the land electrode of the circuit board, the solder including a first solder portion adhered to the side electrode and a second solder portion provided between the bottom electrode and the land electrode; and
a mold member formed on the main surface of the circuit board so as to seal the chip component,
wherein the first solder portion is overlapped with the overlapped portion of the resist pattern in planar view,
a first gap is formed between the overlapped portion of the resist pattern and the first solder portion, and
the first gap is filled with a first portion of the mold member.

2. The electronic module as claimed in claim 1, wherein a part of the bottom electrode is overlapped with the overlapped portion of the resist pattern in planar view,
a second gap is formed between the overlapped portion of the resist pattern and the part of the bottom electrode, and
the second gap is filled with a second portion of the mold member.

3. The electronic module as claimed in claim 1, further comprising a conductive film that covers an outer surface of the mold member.

4. The electronic module as claimed in claim 1, wherein the chip component further includes a first side surface substantially perpendicular to a longitudinal direction of the chip component,
the side electrode includes a first side electrode formed on the first side surface, and
the first portion of the mold member is provided at least between the overlapped portion and the first solder portion adhered to the first side electrode.

5. The electronic module as claimed in claim 1, wherein the first solder portion is substantially separated from the second solder portion by the overlapped portion of the resist pattern.

6. The electronic module as claimed in claim 1, wherein the chip component comprises a terminal electrode which includes the bottom electrode, the side electrode and an upper electrode formed on an upper surface of the chip component.

7. The electronic module as claimed in claim 1, wherein the overlapped portion of the resist pattern comprises a U-shaped pattern formed with a constant width along three sides of an outer side of the land electrode.

8. The electronic module as claimed in claim 2, wherein the chip component further includes a bottom surface having a first exposed portion being free from the bottom electrode,
the main surface of the circuit board includes a second exposed portion being free from the land electrode, and
the mold member further having a third portion filling a third gap between the first and second exposed portions.

9. The electronic module as claimed in claim 4, wherein the chip component further includes second and third side surfaces substantially parallel to the longitudinal direction of the chip component,
the side electrode further includes a second side electrode and a third side electrode respectively formed on a second side surface and a third side surface, and
the first portion of the mold member is further provided between the overlapped portion and the first solder portion adhered to the second and third side electrodes.

10. The electronic module as claimed in claim 6, wherein the land electrode comprises an area which is greater than an area of the terminal electrode in the planar view.

11. The electronic module as claimed in claim 8, wherein a height of the third gap between the first and second exposed portions is in a range from 10 μm to 70 μm.

12. A mounting structure of a chip component, comprising:
a circuit board;
a plurality of chip components surface-mounted on the circuit board;
solders that electrically connect the chip components and the circuit board; and
a mold member that seals the chip components, wherein the circuit board includes a wiring layer including a plurality of lands and a solder resist layer that selectively covers the wiring layer,
wherein the solder resist layer includes resist patterns that partially covers the lands, each of the chip components includes a bottom electrode parallel to a surface of the circuit board and a side electrode perpendicular to the surface of the circuit board,
each of the solders electrically connects the bottom electrode and the side electrode and an exposed portion of the land, each of the resist patterns has an overlapped portion overlapped with the bottom electrode in a planar view,
each of the solders has a first solder portion adhered to the side electrode and a second solder portion between the bottom electrode and the exposed portion of the land,
the first solder portion is overlapped with the overlapped portion of the resist pattern in planar view,
at least a first gap is formed between the overlapped portion of the resist pattern and the first solder pattern, and
at least the first gap is filled with the mold member.

13. The mounting structure of a chip component as claimed in claim 12, wherein a part of the bottom electrode is overlapped with the overlapped portion of the resist pattern in planar view,
a second gap is formed between the overlapped portion of the resist pattern and the part of the bottom electrode, and
the second gap is filled with the mold member.

14. The mounting structure of a chip component as claimed in claim 12 further comprising a conductive film that covers a surface of the mold member.

15. The mounting structure of a chip component as claimed in claim 12, wherein the side electrode includes a first side electrode formed on a first side surface of the chip component, and the overlapped portion includes a first strip pattern provided along the first side electrode.

16. The mounting structure of a chip component as claimed in claim 13, wherein a third gap between each of the chip components and the circuit board is filled with the mold member.

17. The mounting structure of a chip component as claimed in claim 15, wherein the side electrode further includes second and third side electrodes respectively formed on second and third side surfaces of the chip component perpendicular to the first side surface, and the overlapped portion further includes a second strip pattern provided along the second side electrode and a third strip pattern provided along the third side electrode.

* * * * *